United States Patent [19]

Miller et al.

[11] Patent Number: 4,603,375
[45] Date of Patent: Jul. 29, 1986

[54] EJECTOR FOR PRINTED CIRCUIT BOARD PLUG-IN UNIT

[75] Inventors: William J. Miller, Fullerton; Steve A. Alaniz, Monterey Park, both of Calif.

[73] Assignee: Zero Corporation, El Monte, Calif.

[21] Appl. No.: 704,768

[22] Filed: Feb. 21, 1985

[51] Int. Cl.[4] .................................................. H01R 13/62
[52] U.S. Cl. ................................. 361/399; 339/17 LC; 339/45 M; 361/415
[58] Field of Search .................................. 361/399–400, 361/391, 412, 419–420, 413, 415; 339/45 M, 45 R, 17 LC, 17 L

[56] References Cited

U.S. PATENT DOCUMENTS

| | | | |
|---|---|---|---|
| 3,944,311 | 3/1976 | Sprenkle et al. | 339/45 M |
| 4,064,551 | 12/1977 | Lightfoot | 361/399 |
| 4,564,250 | 1/1986 | Klein et al. | 361/412 X |

FOREIGN PATENT DOCUMENTS

| | | | |
|---|---|---|---|
| 1037240 | 8/1978 | Canada | 361/415 |
| 2812631 | 10/1978 | Fed. Rep. of Germany | 339/45 |
| 2823422 | 12/1978 | Fed. Rep. of Germany | 361/415 |
| 0609220 | 5/1978 | U.S.S.R. | 361/415 |

Primary Examiner—Arthur T. Grimley
Assistant Examiner—Jane K. Lau
Attorney, Agent, or Firm—Edward J. DaRin

[57] ABSTRACT

An ejector for a printed circuit board plug-in unit for use with printed circuit board cages having a fixed ejection surface. The ejector is constructed and defined to be pivotally mounted through an aperture provided for the panel member of the plug-in unit for pivotally engaging the fixed ejection surface of the cage system for extracting the electrical connector carried by the printed circuit board of the plug-in unit from the electrical connector of the cage system. The ejector has a handle portion with an extraction portion extending through the aperture of the panel along with a portion defining a bearing surface for engaging the fixed ejection surface. A bracket secured to the panel member also pivotally secures the ejector extraction portion to the printed circuit board.

11 Claims, 9 Drawing Figures

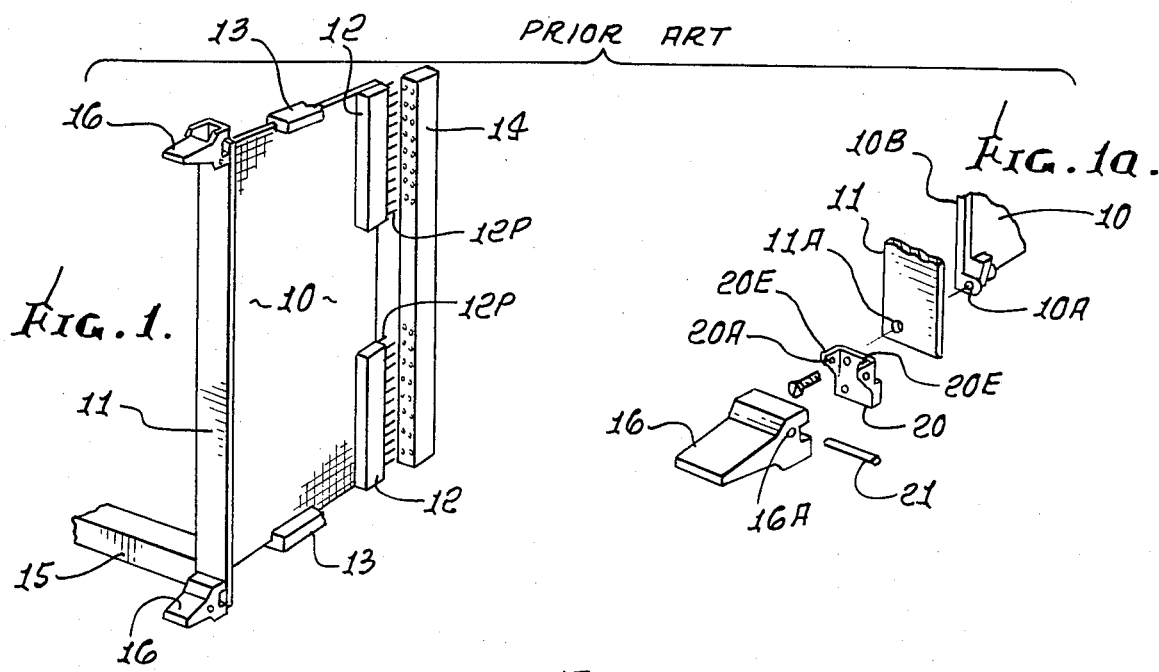
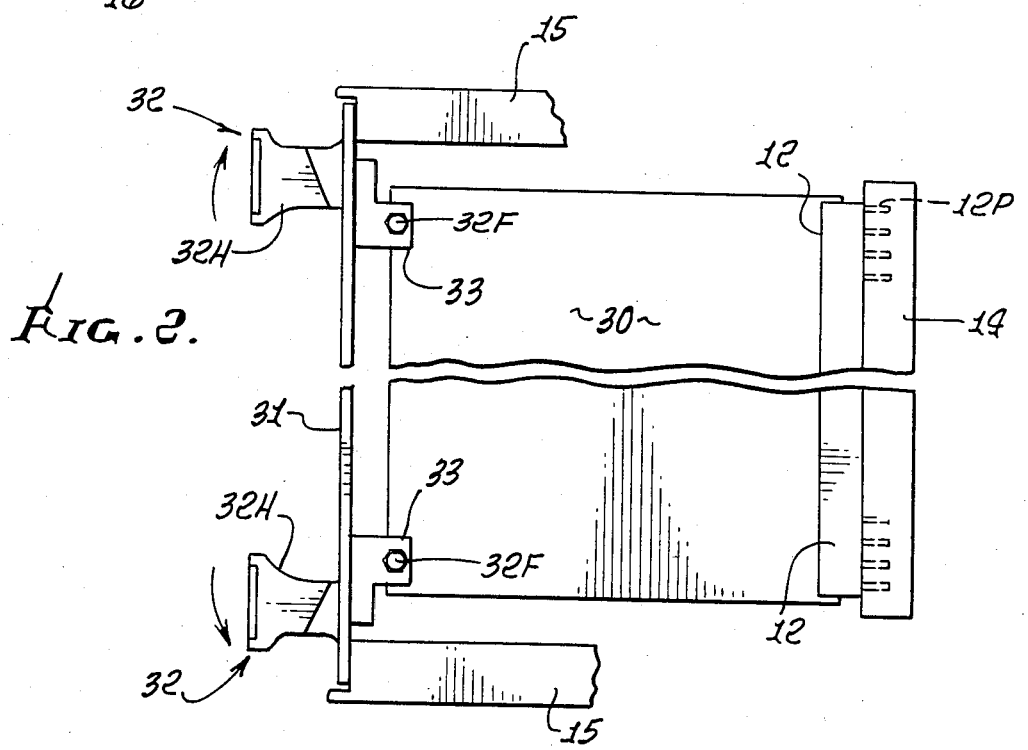
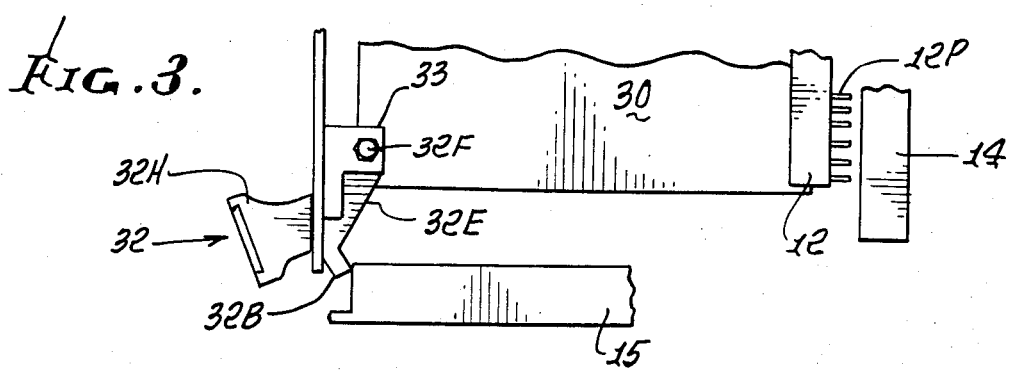

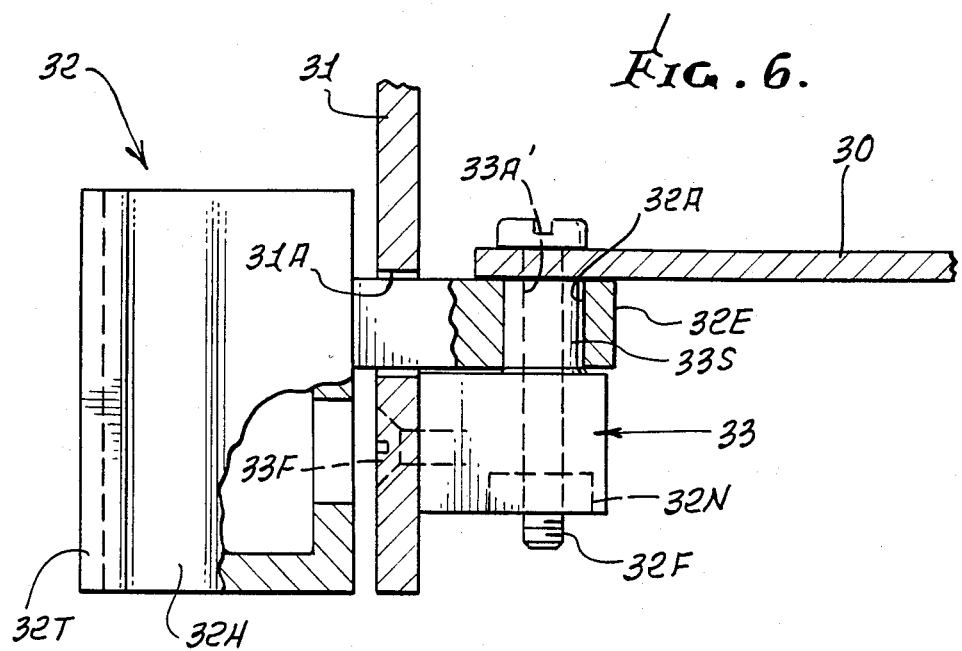
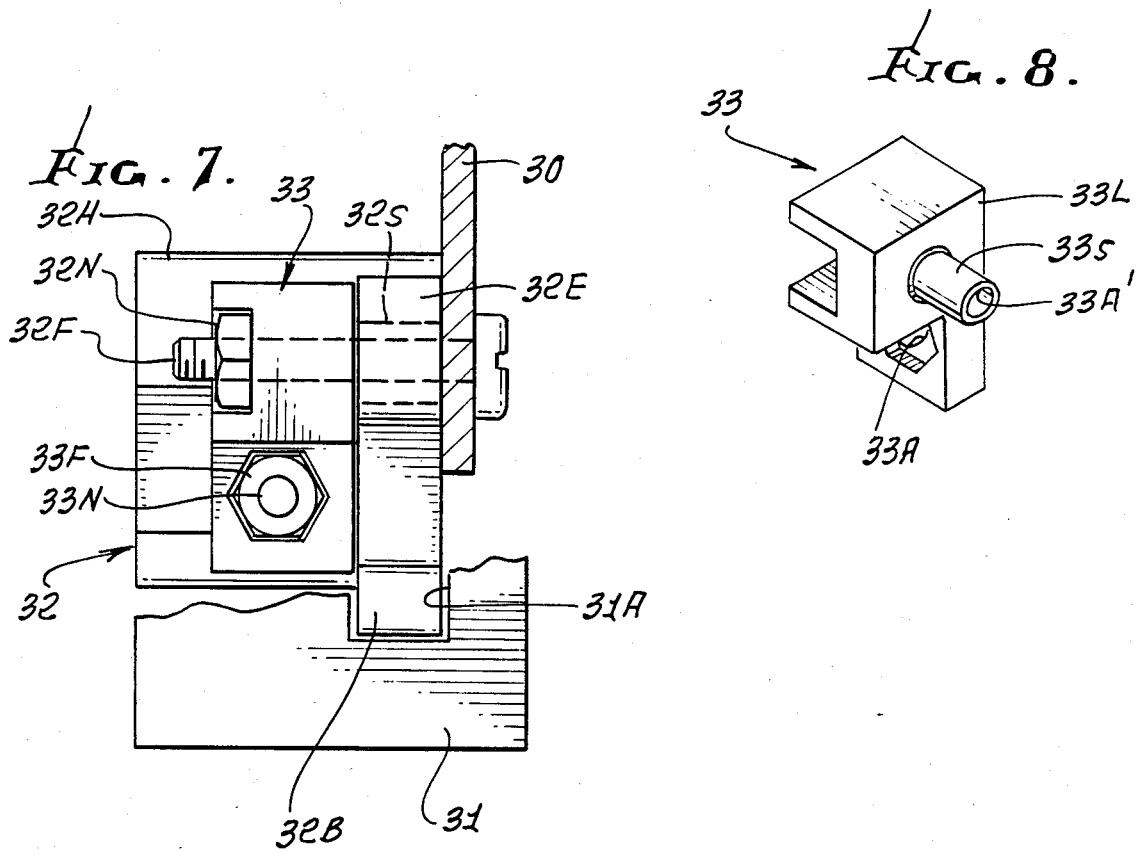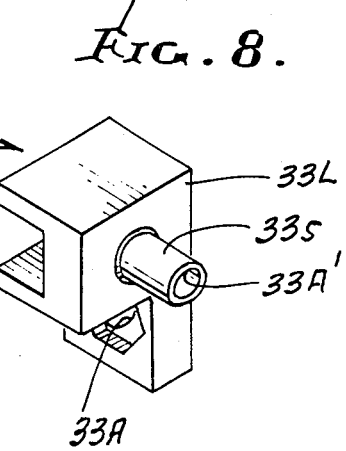

EJECTOR FOR PRINTED CIRCUIT BOARD PLUG-IN UNIT

FIELD OF INVENTION

This invention relates to an ejector for a printed board and more particularly to a printed circuit board plug-in unit for a printed circuit board cage wherein the printed circuit board has a panel member integrally secured thereto and an ejector is mounted with the panel for extracting the printed circuit board connector from the electrical connector for the card cage subassembly.

BACKGROUND OF INVENTION

There has been utilized for a number of years a system of printed circuit board subracks, also known as card cages, that include mounting hardware for a printed circuit board. The card cages include a pair of spaced card guides for slidably receiving the opposite edges of a printed circuit board. The card cages are interconnected with the printed circuit board by means of an electrical connector aligned with the electrical connector or connectors carried by the printed circuit board and to be placed in an electrically conductive circuit relatinship therewith. In this arrangement, it is common for the end of the printed circuit board opposite to the end mounting the electrical connector to be secured in a perpendicular; integrated relationship with the panel member. This integral unit is referred to as a plug-in unit in the art. The gripping action provided by the two interconnected electrical connectors; namely, the connector or connectors carried by the printed circuit board and the electrical connector associated with the subrack or card cage, make it difficult to remove the printed circuit board plug-in unit from the electrical connector of the card cage system. Two handles are generally mounted on the front panel of the plug-in unit to permit the plug-in unit to be manually pulled from the card cage connectors. Ejectors have also been mounted on the front panel of the plug-in unit board as an aid in extracting the printed circuit board plug-in unit from the electrical connector of the card cage or subrack. In this subrack or card cage, a common surface is conventionally provided adjacent the front panel of the plug-in unit to function as a fixed ejection surface for any ejector mounted to the front panel member. Present day ejectors are mounted wholly on the front face of the panel of the plug-in unit and extract the printed circuit board from the card cage connector upon the application of a pivoting force applied to the ejector that is transmitted against the fixed ejection surface to provide the extraction action. These ejectors function by means of the front panel being pivoted against the fixed ejection surface in response to a pivoting force applied to the ejector.

SUMMARY OF INVENTION

The present invention provides an improved, relatively inexpensive ejector structure for a printed circuit board plug-in unit that is constructed of a minimum number of parts. The ejector structure per se of the present invention is adapted to be operative with the coventional, common ejector surface provided in the subracks or card cages having a prescribed format by being pivotable through an aperture in the front panel of the plug-in unit. The ejector also is constructed and defined with a bracket coacting with the ejector proper for providing the pivoting action, as well as securing the printed circuit board, ejector and front panel together. The ejector may have the same general, external configuration as conventional handles provided for a plug-in unit. To this end, the configuration of the ejector may include a removable panel for displaying printed circuit board identification data.

From a broad standpoint, the ejector of the present invention comprises ejector handle means having an ejecting handle portion adapted for operating the ejector and an extraction portion. The extraction portion is constructed and defined with a section thereof for permitting the pivotal movement of the ejector handle means and a section spaced from the extraction portion for providing an extraction bearing surface. The ejector also includes bracket means constructed and defined to be secured to the panel of the printed circuit board plug-in unit and to mount the extraction portion of the ejector handle means in a pivotal relationship with respect to the printed circuit panel. The bracket means is further adapted to secure a printed circuit board and the extraction portion of the ejector thereto while permitting the pivotal movement of the ejector handle means.

From the standpoint of a printed circuit board plug-in unit for a card cage having a pair of printed circuit board cage guides arranged with an electrical connector spaced adjacent the ends of the card guides and between the card guides to receive the plug-in unit at the electrical connector for the card cage, the plug-in unit of the present invention comprises a printed circuit board plug-in unit comprising a printed circuit board; a panel member integrally secured to one end of the printed circuit board in a plane substantially perpendicular thereto and an electrical connector secured to the printed circuit board adjacent the opposite end of the printed circuit board from the panel member. The printed circuit board electrical connector is adapted to be electrically interconnected to the electrical connector for the card cage when the plug-in unit is mounted between the card guides. A common surface for the card cage, functioning as a fixed ejection surface is utilized for extracting the electrical connector or connectors secured to the printed circuit board from the electrical connector for the card cage. The ejecting surface is arranged immediately adjacent the inside of the panel member of the plug-in unit when the two electrical connectors are interconnected. The panel member has an aperture adjacent at least one end of the panel member for exposing the ejecting surface therethrough. Bracket means is secured to the panel member adjacent the aperture for the panel member and printed circuit card ejecting means. The ejecting means is constructed and defined to extend through the aperture for the panel for engaging the common ejecting surface while being accessible for pivotal movement on the opposite side of the panel member. The ejecting means and the bracket means are defined relative to one another for permitting the pivotal movement of the ejecting means relative to the bracket means to cause the ejecting means to engage the common ejecting surface in response to a pivoting force being applied to the ejecting means for extracting the electrical connectors from one another in response to the pivotal movement of the ejecting means, and means for securing the bracket means and the ejecting means to the printed circuit board while permitting the pivotal movement of said ejecting means.

BRIEF DESCRIPTION OF THE DRAWINGS

These and other features of the present invention may be more fully appreciated when considered in the light of the following specification and drawings, in which:

FIG. 1 is a diagrammatic representation of a prior art, printed circuit board plug-in unit of a fixed format and showing the printed circuit board connector disengaged from the electrical connector for the card cage;

FIG. 1a is an exploded view of the prior art type of plug-in unit ejector as illustrated in FIG. 1.

FIG. 2 is a partial, simplified, side elevational view of the plug-in unit embodying the present invention with the printed circuit board electrical connectors and the card cage electrical connector shown in an interconnected, operative relationship;

FIG. 3 is a partial, simplified, side elevational view of the unit of FIG. 2 with the ejector illustrated in a pivoted, extraction position and with the electrical connectors disconnected from one another in an inoperative relationship;

FIG. 6 is a partial, top view, with portions broken away and in section of the plug-in unit of FIG. 4;

FIG. 7 is a rear, elevational view, with portions broken away of the plug-in unit of FIG. 4; and FIG. 8 is a detached, perspective view of the bracket element of the ejector of the present invention.

DETAILED DESCRIPTION OF THE PREFERRED EMBODIMENT

Figure 4:
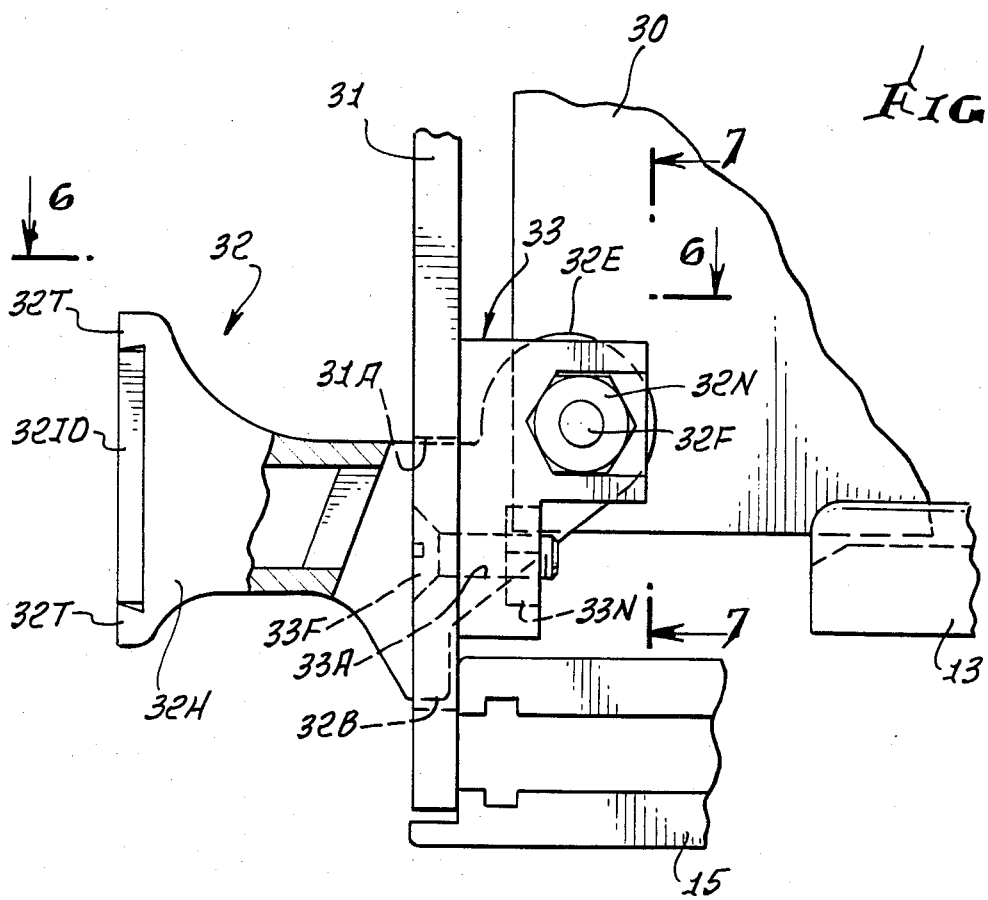
FIG. 4 is a partial, enlarged, side elevational view of the plug-in unit of the present invention, with portions illustrated in section, illustrating the ejector and printed circuit board plug-in unit when mounted in a card cage in an operative relationship as in FIG. 2.

Now referring to the drawings, the ejector for the printed circuit board plug-in unit of the present invention will be examined in detail. In order to better understand the present invention, the prior art printed circuit board plug-in units as applied to a conventional printed circuit board subrack or card cage will first be examined and its relationship with a typical prior art printed circuit board ejector. The printed circuit board 10 illustrated in FIG. 1 is mounted with a conventional, integral panel member 11 secured to one end of the printed circuit board 10 in a perpendicular relationship therewith. The printed circuit board 10 carries an electrical connector 12 having male pins 12P extending outwardly therefrom, or the pins 12P as illustrated. Two such electrical connectors 12 are illustrated in FIG. 1 that are arranged adjacent opposite corners of the printed circuit board 10 and adjacent the inner edge thereof. The subrack or card cage is generally defined by a pair of spaced card guides 13 (partially illustrated) of conventional construction. The card guides 13 are provided with a longitudinal slot to slidably receive and guide the opposite edges of the printed circuit board 10 in its travel toward the end of the card cage. The subrack or card cage includes an electrical connector 14 that is mounted in a spaced relationship with the card guides 13 and fixed in position between the ends of the guides so as to receive the male pins 12P of the connectors 12 in electrical circuit relationship. The card cage connector 14 is suitably supported (not shown) in a fixed position and may have female receptacles for receiving the pins 12P. The usual configuration of the subrack or card cage includes a common ejecting surface for the card cage for functioning as a fixed ejection surface 15 for extracting the electrical connectors 12 from the electrical connector 14. The connectors 12 and 14 are illustrated in an extracted relationship in FIG. 1. The ejecting surface is arranged immediately behind the panel 11 for the plug-in unit when the two electrical connectors are interconnected and on the same side of the panel member 11 as the printed circuit board 10. Usually, a pair of handles are attached to the front panel 11 to permit the plug-in unit to be manually pulled from the connector 14. It has been found that due to the gripping action between the connectors 12 and 14, it is difficult to remove a plug-in unit from the electrical connector 14. To aid in the extraction of the connectors 12 and 14, an ejector has been designed, such as the ejector 16 that is mounted to the front panel 11 of the plug-in unit. As illustrated in FIG. 1, a pair of ejectors 16 may be mounted adjacent the opposite ends of the panel member 11. Also, in the usual arrangement, a fixed ejecting surface is usually mounted behind panel member 11 at the top and bottom for the purposes of providing a desired ejecting action at both ejectors 16. Only one of the fixed surfaces 15 is illustrated in FIG. 1, it being recognized that the second surface would be spaced adjacent the topmost ejector 16 as illustrated in FIG. 1. The bottom ejector 16 of FIG. 1 functions in response to a pivoting force applied thereto and which force would be applied in a downward direction as illustrated in FIG. 1. The pivoting force applied to the ejector 16 functions through the panel 11 against the fixed ejecting surface 15 to cause the plug-in unit to be moved oubwardly from the electrical connector 14 in response thereto. A similar action occurs when an upwardly directed pivoting force is applied to the top ejector 16 of FIG. 1.

The arrangement of the ejector 16, panel member 11 and printed circuit board 10 is illustrated in FIG. 1a in an exploded relationship. The printed circuit board 10 is provided with an integral bracket 10B fixed along one edge thereof that is provided with a mounting aperture 10A to receive a fastener for securing it to the panel member 11. The ejector 16 of FIGS. 1 and 1a includes a U-shaped bracket 20 having a pair of outwardly extendihg ears 20E with aligned apertures 20A for receiving the pivot pin therein. The bracket 20 is secured to the printed circuit board mounting 10B by being mounted through a suitable aperture therein and through the aperture 11A provided for the panel member 11 and the aperture 10A for the printed circuit board bracket 10B. The ejector 16, then, is pivotally secured to the bracket 20 by means of the pivot pin 21 which is mounted through the ejector aperture 16A and is mounted to the apertures 20A of the bracket 20 for affording the pivoting action of the ejector 16. Accordingly, it should be appreciated that with the pivoting force applied in a downward direction to the ejector 16 that the force will be transmitted through the panel member 11 to the ejecting surface 15 so as to cause the printed circuit board 10 and electrical connectors 12 to move outwardly from the connector 14.

Now referring to FIGS. 2 through 8, the improved ejector 32 for a printed circuit board plug-in unit for use in a card cage of the type described in conjunction with FIG. 1 will now be examined. The plug-in unit includes a printed circuit board 30 (the printed circuit is not illustrated) that is integrally mounted with the panel member 31 adjacent one end thereof. As illustrated in FIG. 2, an ejector 32 may be secured adjacent the top and bottom edges of the panel member 15, although in some applications only one ejector 32 may be necessary. Since the action is the same for the two ejectors, only one needs to be described. In accordance with the present invention, the ejector 32 is mounted by means of the panel member 31 through an aperture 31A for securing it to a bracket member 33 and to the printed circuit board 30. The printed circuit board 30 carries two electrical connectors 12 adjacent the opposite inside corners of the board 30, as illustrated in FIG. 2. The plug-in unit is illustrated in FIG. 2 in its operative relationship with the electrical connector 14 for the card cage and in its extracted position with respect to the electrical connector 14 in FIG. 3. The ejector 32 is provided with a handle portion 32H that longitudinally extends through the panel aperture 31A and includes a pivotable extraction portion 32E permitting the pivotal movement of the ejector handle portion 32H through the aperture 31A. The handle portion 32H includes a dependent bearing portion 32B for providing an extraction bearing surface relative to the fixed surface 15. The bracket 33 is constructed and defined to be secured to the printed circuit board 30 and to mount the extraction portion 32E of the ejector handle portion 32H in a pivotal relationship with respect to the printed circuit board 30. The bracket means 33 is adapted to secure the printed circuit board 30 by means of a fastener 32F which is adapted to secure the printed circuit board and the extraction portion 32E of the ejector 32, while permitting the pivotal movement of the ejector handle means 32H through the aperture 31A relative to the panel member 31.

Figure 5:
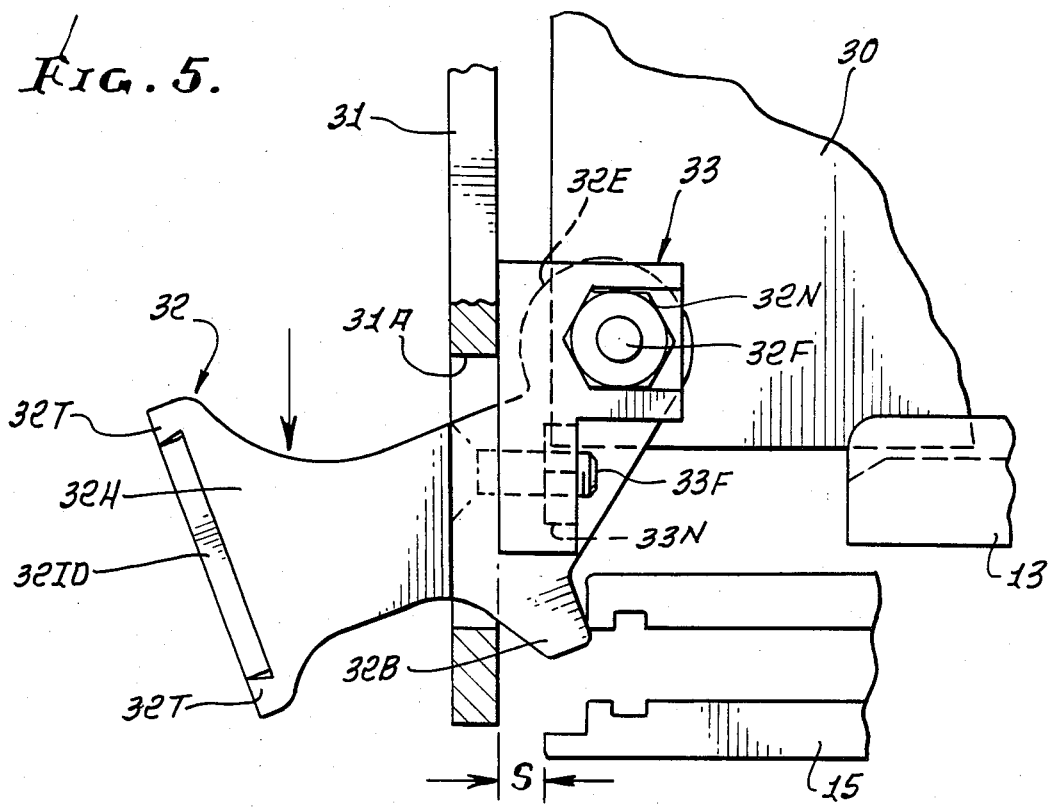
FIG. 5 is a partial, enlarged, side elevational view of the plug-in unit of FIG. 4, with portions in section, after the ejector has been pivoted and the plug-in unit has been moved to an inooerative relationship as in FIG. 3.

At this point, attention is directed to FIG. 8 which illustrates the bracket means 33 in a detached relationship with the panel member 31. FIG. 8 illustrates the configuration of the bracket means 33 to be essentially an L-shaped configuration. The long arm of the L configuration of the bracket means 33 or the surface of the right hand side of the element as it is viewed in FIG. 8, would be arranged flush with the back side of the panel member 31; i.e., see FIG. 4. This surface is provided with an aperture for receiving a fastener for securing the bracket to the back side of the panel member 31. For this purpose, the panel member 31 is provided with a countersunk hole adjacent one corner of the aperture 31A for the ejector 32. As illustrated in FIG. 8, the fastener 33F would be mounted in the countersunk hole from the front of the panel member 31 and to extend through the aperture 33A to the opposite side of the bracket means 33. The aperture 33A on the opposite side of the bracket means 33 is shaped to accept a hexagonal shaped nut at the end of the fastener 33F or the nut 33N, as illustrated in FIGS. 4, 5 and 7. When the fastener 33F is secured to the corresponding nut 33N, the bracket means 33 will be secured to the back side of the panel member 31 immediately behind the handle portion 32H of the ejector 32, as can be appreciated from examining the drawings. The bracket means 33 is defined with a stub shaft 33S extending from the other leg of the L-shaped bracket means 33, or the leg 33L, as viewed in FIG. 8. The stub shaft 33S is sized to accept the circular aperture 32A provided at the extraction portion 32E of the ejector 32; see FIG. 6. The stub shaft 33S is hollow to accept the pivot pin or fastener 32F. To this end, the fastener 32F is secured to the outside surface of the printed circuit card 30, through the aperture 32A for the extraction portion 32E of the ejector 32 and through the central opening 33A' for the stub shaft 33S and to the opposite side of the arm 33L wherein it is secured by a suitable nut 32N for the fastener 32F. It should now be appreciated that with this configuration, the bracket means 33 will be secured to the panel member 31 and the bracket means 33 in turn pivotally secures the extraction portion 32E of the ejector 32 to the board 30 so as to cause the printed circuit board 30 to respond to the pivotal extraction motion of the ejector 32. It should be recognized that the bracket means 33 and ejectors 32 are constructed as right and left hand elements. To this end, the stub shaft 33S may extend in the opposite direction from that illustrated in FIG. 8 and the corresponding ejector 33 has its extraction portion 33E arranged for coaction therewith.

When the ejector 32 is moved downwardly, as illustrated in FIG. 5, the mechanical leverage provided by the bearing surface 32B engaging the fixed ejecting surface 15 causes the front panel member 31 to be spaced from the end of the fixed ejecting surface 15 a distance denoted in FIG. 5 as S. This S distance is the distance that the connectors 12 on the printed circuit board 30 are moved away from the fixed electrical connector 14 of the card cage system.

The handle portion 32H of the ejector 32 is advantageously defined to have the same general configuration as the handles provided on a standard printed circuit plug-in unit to manually extract the plug-in unit. In addition, the front face of the handle portion is configured to permit an identification member 32ID to be slidably positioned in the front face thereof. The panel member 32ID may carry circuit board data identifying the particular printed circuit board 30 for convenience of the user. The panel 32ID is longitudinally slidable out of the ends of the U-shaped retainer defined by the tabs 32T on the front face of the handle portion 32H of the ejector 32. When the panel member 32ID is removed from the handle portion 32H of the ejector 32, it will expose the head of the fastener 33F through the aperture 32F to permit it to be removed.

We claim:

1. A printed circuit board plug-in unit for a card cage having a pair of printed circuit board card guides arranged with an electrical connector spaced adjacent the end of the card guides and between the card guides to receive the plug-in unit at said electrical connector, comprising a printed circuit board plug-in unit comprising a printed circuit board; a panel member secured to one end of the printed circuit board in a plane substantially perpendicular thereto; and an electrical connector secured to said board adjacent the opposite end of the printed circuit board from said panel member, said electrical connector being adapted to be electrically interconnected to the electrical connector for the card cage when the plug-in unit is mounted between the card guides; a common ejecting surface for the card cage functioning as a fixed ejection surface for extracting the electrical connector secured to the printed circuit board from the electrical connector for the card cage, said ejecting surface being arranged immediately adjacent the panel member when the two electrical connectors are interconnected and on the same side of the panel member as the printed circuit board, said panel member having an aperture adjacent at least one end of the panel member for exposing said ejecting surface therethrough; bracket means secured to said panel member adjacent the aperture for the panel member; printed circuit card ejecting means, said ejecting means being constructed and defined to extend through the aperture for the panel for engaging said ejecting surface while being accessible for pivotal movement on the opposite side of the panel member, said ejecting means and said bracket means being defined relative to one another for permitting the pivotal movement of said ejecting means relative to said bracket means to cause the ejecting means to engage the ejecting surf.ace in response to a pivoting force being applied to the ejecting means for extracting the electrical connectors from one another in response to the pivotal movement of the ejecting means, and means for securing said bracket means and said ejecting means to said printed circuit board while permitting said pivotal movement of said ejecting means.

2. A printed circuit board plug-in unit for a card cage as defined in claim 1 wherein said ejecting means is constructed and defined with a handle portion mountable on the opposite side of the panel member from the printed circuit board and with a pivotable extracting portion extending longitudinally therefrom and extending through said panel aperture, said extracting portion of said ejecting means having a coacting portion defined relative to said bracket means for pivotal movement relative thereto and including a bearing surface portion for engaging said ejecting surface in response to a pivoting force being applied to said handle portion of said ejecting means and defined to be normally spaced from said ejecting surface.

3. A printed circuit board plug-in unit for a card cage as defined in claim 2 wherein said extracting portion for said ejecting means is defined with, an aperture for receiving a coacting portion of said bracket means and said bracket means includes a coacting portion interfitting with said aperture means for said extracting portion for permitting the pivotal movement of said ejecting means relative to said bracket means.

4. A printed circuit board plug-in unit for a card cage as defined in claim 3 wherein the aperture for said extracting portion of said ejecting means is a substantially circular aperture sized to pivotally interfit with the coacting portion of said bracket means, said coacting portion of the bracket means comprising a stub shaft sized to pivotally receive said extracting portion of said ejection means.

5. A printed circuit board plug-in unit for a card cage as defined in claim 2 or 4 wherein said handle portion of said ejecting means is constructed and defined with preselected concave surfaces on the opposite sides of the handle portion for operating the handle portion.

6. A printed circuit board plug-in unit for a card cage as defined in claim 2 wherein said handle portion of said ejecting means is constructed and defined with preselected concave surfaces on the opposite sides of the handle portion for operating the handle portion and wherein the front face of said handle portion includes removable panel means for identifying the printed circuit board.

7. An ejector comprising ejector handle means having an ejecting handle portion adapted for operating the ejector and an extraction portion, the extraction portion being constructcd and defined with a section thereof for permitting the pivotal movement of said ejector handle means and a section spaced from said extraction portion for proving an extraction bearing surface, and bracket means constructed and defined to be secured to a printed circuit board and to mount the extraction portion of the ejector handle means in a pivotable relationship with respect to the printed circuit board, the bracket means being adapted to secure a printed circuit board and said extraction portion thereto while permitting said pivotal movement of the ejector handle means.

8. An ejector comprising ejector handle means as defined in claim 7 wherein the extraction portion for said ejector handle means is defined with an aperture for receiving a coacting member of said bracket means and said bracket means includes a portion sized for interfitting with said aperture means of said extraction portion while permitting said pivotal movement of said ejecting handle means relative to said bracket means.

9. An ejector comprising ejector handle means as defined in claim 8 wherein the aperture for said extracting means is a substantially circular aperture sized to interfit with the coacting member of said bracket means, said coacting portion of the bracket means comprising stub shaft means sized to be pivotally received at said circular aperture means.

10. An ejector comprising ejector handle means as defined in claim 7 or 8 wherein said ejector handle means and said bracket means are molded from a thermoplastic material.

11. An ejector comprising ejector handle means as defined in claim 7 or 9 wherein said handle portion of the ejector handle means has a face adapted to removably mount panel means adapted for carrying identification data thereon.

* * * * *

UNITED STATES PATENT AND TRADEMARK OFFICE
CERTIFICATE OF CORRECTION

PATENT NO.  : 4,603,375
DATED       : July 29, 1986
INVENTOR(S) : William J. Miller and Steve A. Alaniz It is certified that error appears in the above-identified patent and that said Letters Patent is hereby corrected as shown below:

Column 8, Claim 7, line 17, the word "proving" should be changed to read -- providing --

Signed and Sealed this

Thirty-first Day of March, 1987

*Attest:*

DONALD J. QUIGG

*Attesting Officer*    *Commissioner of Patents and Trademarks*